United States Patent
Wu et al.

(10) Patent No.: US 10,297,297 B2
(45) Date of Patent: May 21, 2019

(54) SAMPLING MODULE INCLUDING DELAY LOCKED LOOP, SAMPLING UNIT, MEMORY CONTROL UNIT, AND DATA SAMPLING METHOD THEREOF

(71) Applicant: PHISON ELECTRONICS CORP., Miaoli (TW)

(72) Inventors: Jen-Chu Wu, New Taipei (TW); Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 71 days.

(21) Appl. No.: 14/578,471

(22) Filed: Dec. 21, 2014

(65) Prior Publication Data

US 2016/0134292 A1 May 12, 2016

(30) Foreign Application Priority Data

Nov. 7, 2014 (TW) .............................. 103138737 A (51) Int. Cl.
  *G11C 7/22* (2006.01)
  *H03K 5/159* (2006.01)
  *G11C 7/10* (2006.01)
  *H03L 7/081* (2006.01)

(52) U.S. Cl.
  CPC ............ *G11C 7/222* (2013.01); *G11C 7/1066* (2013.01); *H03K 5/159* (2013.01); *H03L 7/0812* (2013.01)

(58) Field of Classification Search
  CPC ........ G11C 7/222; H03K 5/159; H03L 7/0812
  USPC ....................................................... 327/158
  See application file for complete search history.

(56) References Cited

U.S. PATENT DOCUMENTS

| 6,539,072 | B1 * | 3/2003 | Donnelly | G06F 1/10 327/158 |
| 6,911,853 | B2 * | 6/2005 | Kizer | G06F 1/10 327/158 |
| 7,236,028 | B1 * | 6/2007 | Choi | H03L 7/0812 327/149 |
| 7,911,873 | B1 * | 3/2011 | Menon | G11C 7/1066 365/194 |
| 9,449,660 | B2 * | 9/2016 | Wu | G11C 7/22 |

(Continued)

OTHER PUBLICATIONS

Saleh et al ("System-on-Chip: Reuse and Integration", Proceedings of the IEEE, vol. 94,No. 6, Jun. 2006).*

*Primary Examiner* — Mushfique Siddique
(74) *Attorney, Agent, or Firm* — JCIPRNET (57) ABSTRACT

A sampling circuit module, a memory control circuit unit, and a data sampling method, where the sampling circuit module includes a delay lock loop (DLL) and a sampling circuit. The DLL includes a clock control circuit, a clock delay circuit and a voltage control circuit. The clock control circuit performs a delay lock for a reference clock signal, so as to output a selecting signal. The clock delay circuit delays the reference clock signal according to the selecting signal, so as to output a delay clock signal. The voltage control circuit adjusts a driving voltage outputted to the clock control circuit and the clock delay circuit according to the selecting signal. The sampling circuit samples a data signal according to the delay clock signal. Accordingly, a delay ability of the DLL may be improved by adjusting the driving voltage.

24 Claims, 7 Drawing Sheets

(56) References Cited

U.S. PATENT DOCUMENTS

| | | | | |
|---|---|---|---|---|
| 2003/0215041 A1* | 11/2003 | Gauthier | ............... | H03L 7/0812 |
| | | | | 375/376 |
| 2005/0073344 A1* | 4/2005 | Furuya | ................. | H03L 7/0812 |
| | | | | 327/158 |
| 2005/0174155 A1* | 8/2005 | Heightley | ............... | H03L 7/085 |
| | | | | 327/158 |
| 2006/0045227 A1* | 3/2006 | Guan | ...................... | G11C 7/02 |
| | | | | 375/376 |
| 2008/0197900 A1* | 8/2008 | Chae | .................... | H03L 7/0805 |
| | | | | 327/161 |
| 2011/0115536 A1* | 5/2011 | Agarwal | ............... | H03L 7/0816 |
| | | | | 327/158 |
| 2012/0063243 A1* | 3/2012 | Hasan | ................. | G11C 7/1093 |
| | | | | 365/189.07 |
| 2013/0083611 A1* | 4/2013 | Ware | ................... | G11C 11/4072 |
| | | | | 365/191 |
| 2013/0121094 A1* | 5/2013 | Zerbe | ..................... | H03L 7/091 |
| | | | | 365/194 |
| 2014/0293719 A1* | 10/2014 | Jung | ........................ | G11C 7/02 |
| | | | | 365/194 |
| 2015/0049849 A1* | 2/2015 | Chen | ......................... | G06F 1/06 |
| | | | | 375/376 |

* cited by examiner

SAMPLING MODULE INCLUDING DELAY LOCKED LOOP, SAMPLING UNIT, MEMORY CONTROL UNIT, AND DATA SAMPLING METHOD THEREOF

CROSS-REFERENCE TO RELATED APPLICATION

This application claims the priority benefit of Taiwan application serial no. 103138737, filed on Nov. 7, 2014. The entirety of the above-mentioned patent application is hereby incorporated by reference herein and made a part of this specification.

BACKGROUND

Technical Field

The invention relates to a clock delay technology, and more particularly, relates to a sampling circuit module and a memory control circuit unit applying the sampling circuit module and a data sampling method.

Description of Related Art

In a memory system, a clock signal is often served as a basis for timing sequence in circuit operations. Generally, a clock signal is generated by an oscillator and transmitted to each chip in the memory system through a connecting line. However, a phase shift may occur during the transmission the clock signal. The temperature and change of a voltage provided by the system may also be reasons which cause the phase shift. The phase shift may lead the memory system to a rise in an error rate when performing a data writing or reading operation.

A delay lock loop (DLL) is used to solve an unsynchronization issue of the clock signal transmitted to each chip. The delay lock loop may be mainly classified into two types, analog delay circuits and digital delay circuits. An analog delay circuit controls a delay time of a delay line by using a voltage, and a digital delay circuit dynamically changes a delay amount or a delay stage of the delay line by means of transmitting an instruction signal.

Generally, in order to improve a delay ability of the delay lock loop, it is usually required to increase a number of delay elements in the delay lock loop. However, a circuit area of the delay lock loop may be increased by an excessive number of the delay elements.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention provides a sampling circuit module, a memory control circuit unit and a data sampling method, which are capable of effectively improving a delay ability of a delay lock loop without adding delay elements.

An exemplary embodiment of the invention provides a sampling circuit module, which includes a delay lock loop and a sampling circuit. The delay lock loop includes a clock control circuit, a clock delay circuit and a voltage control circuit. The clock control circuit is configured to perform a delay lock for a reference clock signal in order to output a selecting signal. The clock delay circuit is coupled to the clock control circuit and configured to delay the reference clock signal according to the selecting signal in order to output a delay clock signal. The voltage control circuit is coupled to the clock control circuit and the clock delay circuit and configured to adjust a driving voltage outputted to the clock control circuit and the clock delay circuit according to the selecting signal. A delay ability of the clock delay circuit is affected by the driving voltage. The sampling circuit is coupled to the delay lock loop and configured to sample a data signal according to the delay clock signal.

A memory control circuit unit is provided according to an exemplary embodiment of the invention and configured to control a rewritable non-volatile memory module. The memory control circuit unit includes a host interface, a memory interface and a sampling circuit module. The host interface is configured to couple to a host system. The memory interface is configured to couple to a rewritable non-volatile memory module. The sampling circuit module includes a delay lock loop and a sampling circuit. The delay lock loop includes a clock control circuit, a clock delay circuit and a voltage control circuit. The clock control circuit is configured to perform a delay lock for a reference clock signal in order to output a selecting signal. The clock delay circuit is coupled to the clock control circuit and configured to delay the reference clock signal according to the selecting signal in order to output a delay clock signal. The voltage control circuit is coupled to the clock control circuit and the clock delay circuit and configured to adjust a driving voltage outputted to the clock control circuit and the clock delay circuit according to the selecting signal. A delay ability of the clock delay circuit is affected by the driving voltage. The sampling circuit is coupled to the delay lock loop and configured to sample a data signal according to the delay clock signal.

An exemplary embodiment of the invention provides a data sampling method, which includes: performing a delay lock for a reference clock signal by a clock control circuit in order to output a selecting signal; delaying the reference clock signal by a clock delay circuit according to the selecting signal in order to output a delay clock signal; adjusting a driving voltage outputted to the clock control circuit and the clock delay circuit according to the selecting signal, wherein a delay ability of the clock delay circuit is affected by the driving voltage; and sampling a data signal according to the delay clock signal.

Based on the above, the invention is capable of adjusting the driving voltage provided to the clock control circuit and the clock delay circuit according to the selecting signal for controlling the delay stage without using additional delay elements, so as to effectively improve the delay ability of the delay lock loop.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In order to make content of the present disclosure more comprehensible, exemplary embodiments are described below as the examples to prove that the present disclosure can actually be realized. However, the invention is not limited to the exemplary embodiments illustrated herein, and a proper combination between the embodiments can also be made. Moreover, elements/components/steps with same reference numerals represent same or similar parts in the drawings and embodiments.

The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
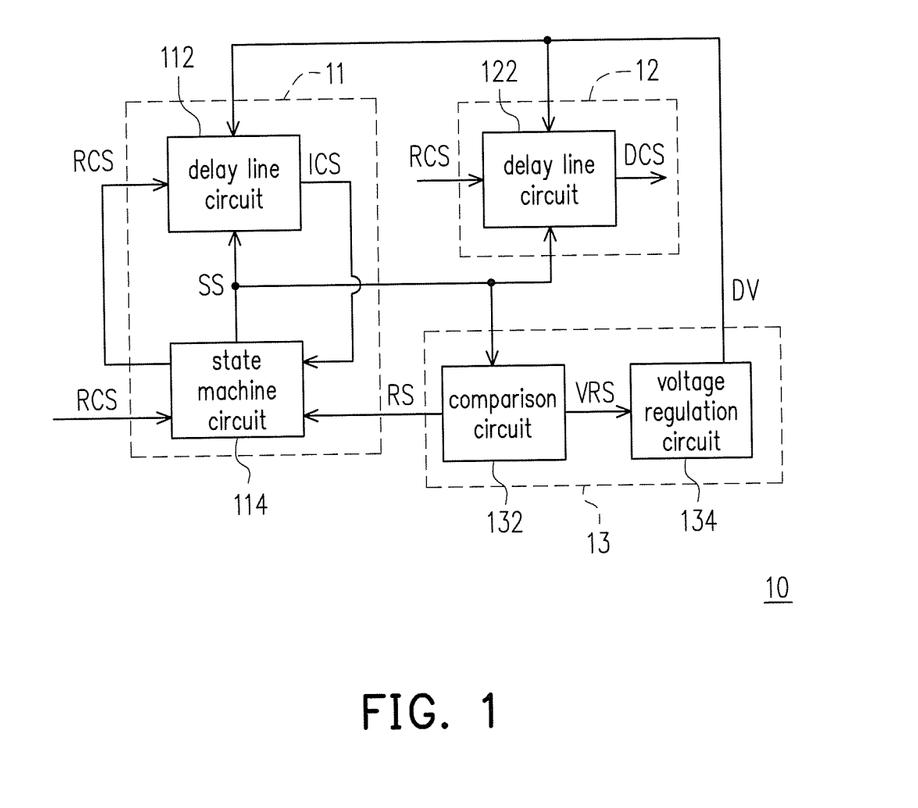
FIG. 1 is a schematic diagram illustrating a delay lock loop (DLL) according to an exemplary embodiment of the invention.

FIG. 1 is a schematic diagram illustrating a delay lock loop (DLL) according to an exemplary embodiment of the invention.

Referring to FIG. 1, a delay lock loop 10 includes a clock control circuit 11, a clock delay circuit 12 and a voltage control circuit 13.

In the present exemplary embodiment, the delay lock loop 10 is also known as a master-slave delay lock loop; the clock control circuit 11 is also known as a master delay circuit in the master-slave delay lock loop; and the clock delay circuit 12 is also known as a slave delay circuit in the master-slave delay lock loop. Generally, in one delay lock loop 10, a number of the clock control circuit 11 is one and a number of the clock delay circuit 12 may be one or more, but the invention is not limited thereto. In the present exemplary embodiment, the delay lock loop 10 is a digital delay lock loop. However, in another exemplary embodiment, the delay lock loop 10 may also be an analog delay lock loop.

The clock control circuit 11 is configured to receive a reference clock signal RCS and perform a delay lock for the reference clock signal RCS in order to output a selecting signal SS. The reference clock signal RCS is generated by, for example, an oscillator or a pulse generator.

The clock delay circuit 12 is coupled to the clock control circuit 11. The clock delay circuit 12 is configured to receive the reference clock signal RCS and the selecting signal SS and delay the reference clock signal RCS according to the selecting signal SS in order to output a delay clock signal DCS.

The voltage control circuit 13 is coupled to the clock control circuit 11 and the clock delay circuit 12. The voltage control circuit 13 is configured to receive the selecting signal SS and adjust a driving voltage DV outputted to the clock control circuit 11 and the clock delay circuit 12. Particularly, the voltage control circuit 13 provides the driving voltage DV to the clock control circuit 11 and the clock delay circuit 12 in order to drive the elements/devices responsible for performing a clock delay in the clock control circuit 11 and the clock delay circuit 12. Alternatively, in an exemplary embodiment, the driving voltage DV may also be considered as a power provided to the clock control circuit 11 and the clock delay circuit 12. A voltage value of the driving voltage DV (or known as the power) affects a delay ability of each of the clock control circuit 11 and the clock delay circuit 12.

The voltage control circuit 13 determines whether the selecting signal SS matches a preset condition. If the selecting signal SS matches the preset condition, the voltage control circuit 13 adjusts the voltage value of the driving voltage DV from a current voltage value (also known as a first voltage value) to another voltage value (also known as a second voltage value). The second voltage value is different from the first voltage value. For example, the voltage control circuit 13 may decrease the voltage value of the driving voltage DV from the first voltage value down to the second voltage value, or increase the voltage value of the driving voltage DV from the first voltage value up to the second voltage value, which are not particularly limited in the invention. On the contrary, if the selecting signal SS does not match the preset condition, the voltage control circuit 13 does not adjust the voltage value of the driving voltage DV.

Implementation details regarding the clock control circuit 11, the clock delay circuit 12 and the voltage control circuit 13 of the present exemplary embodiment are provided as follows. However, it should be noted that, FIG. 1 is merely a schematic diagram of the delay lock loop according to an exemplary embodiment. In another exemplary embodiment, additional electronic elements may be added in the delay lock loop of FIG. 1, and the invention is not limited thereto.

In the present exemplary embodiment, the clock control circuit 11 includes a delay line circuit 112 and a state machine circuit 114.

The delay line circuit 112 is configured to receive the reference clock signal RCS and delay the reference clock signal RCS. When the reference clock signal RCS passes through the delay line circuit 112, the delay line circuit 112 outputs an internal clock signal ICS.

The state machine circuit 114 is configured to receive the reference clock signal RCS and the internal clock signal ICS and generate the selecting signal SS according to a phase difference between the reference clock signal RCS and the internal clock signal ICS. The selecting signal SS is configured to control a delay amount of the delay line circuit 112, such that the phase difference between the internal clock signal ICS and the reference clock signal RCS may approach to a preset value (e.g., a phase of the internal clock signal ICS is ¼ clock cycle behind a phase of the reference clock signal RCS) as much as possible. When the phase of the internal clock signal ICS is far ahead of the phase of the reference clock signal RCS, the selecting signal SS instructs to increase the delay amount of the delay line circuit 112; and when the phase of the internal clock signal ICS is far behind the phase of the reference clock signal RCS, the selecting signal SS instructs to decrease the delay amount of the delay line circuit 112. In an exemplary embodiment, the delay amount of the delay line circuit 112 may also be represented by a delay stage. For example, when the delay stage of the delay line circuit 112 is greater, it indicates that the delay amount of the delay line circuit 112 is greater; and when the delay stage of the delay line circuit 112 is smaller, it indicates that the delay amount of the delay line circuit 112 is smaller. Methods regarding how to control the delay amount or the delay stage of the delay line circuit 112 belong to a common knowledge in the field, which are repeated hereinafter. Particularly, when the phase difference between the internal clock signal ICS and the reference clock signal RCS successfully approaches and maintains at the preset value, it indicates that a phase-locked state has been accomplished. Further, the state machine circuit 114 may include a phase detector (not illustrated) and a microcontroller (not illustrated). The phase detector is configured to detect the phase difference between the internal clock signal ICS and the reference clock signal RCS, and the microcontroller is configured to generate the selecting signal SS according to a detection result of the phase detector.

In the present exemplary embodiment, the clock delay circuit 12 includes a delay line circuit 122.

The delay line circuit 122 is coupled to the state machine circuit 114. A structure of the delay line circuit 122 is identical or similar to that of the delay line circuit 112. The delay line circuit 122 is configured to receive the reference clock signal RCS and the selecting signal SS and delay the reference clock signal RCS according to the selecting signal SS in order to output the delay clock signal DCS. For example, the delay line circuit 122 adjusts the delay stage of the delay line circuit 122 according to the selecting signal SS. When the delay stage of the delay line circuit 122 is adjusted, a length of the delay line circuit 122 is also adjusted accordingly. When the reference clock signal RCS passes through the delay line circuit 122, the delay line circuit 122 outputs the delay clock signal DCS.

In other words, because the selecting signal SS is synchronously outputted to the delay line circuit 112 and the delay line circuit 122, it can be ensured that the delay stage of the delay line circuit 112 and the delay stage of the delay line circuit 122 are updated synchronously. Further, in another exemplary embodiment, the selecting signal SS may also be outputted to more of the delay line circuits 122 in order to synchronously control the more of the delay line circuits 122.

The voltage control circuit 13 includes a comparison circuit 132 and a voltage regulation circuit 134.

The comparison circuit 132 is coupled to the state machine circuit 114. The comparison circuit 132 is configured to receive the selecting signal SS and determine whether a value of the selecting signal SS is greater than a threshold. If the value of the selecting signal SS is greater than the threshold (i.e., the selecting signal SS matches the preset condition), the comparison circuit 132 outputs a voltage regulation signal VRS to the voltage regulation circuit 134. Otherwise, if the value of the selecting signal SS is not greater than the threshold (i.e., the selecting signal SS does not match the preset condition), the comparison circuit 132 does not output the voltage regulation signal VRS. The preset condition and the threshold may be changed based on design requirements. The preset condition may be, for example, increasing or decreasing the driving voltage when the value of the selecting signal SS is not less than a threshold or less than a threshold. It is worth mentioning that, if the selecting signal SS is an analog signal, the value of the selecting signal SS may be compared with the threshold directly (or through specific logical operations). If the selecting signal SS is a digital signal, the selecting signal SS may be converted into a numerical value (e.g., a numerical value in decimal) that can be used to compare with the threshold first before comparing the numerical value with the threshold.

The voltage regulation circuit 134 is coupled to the delay line circuit 112, the delay line circuit 122 and the comparison circuit 132. The voltage regulation circuit 134 is configured to provide the driving voltage DV to the delay line circuits 112 and 122. In addition, the voltage regulation circuit 134 receives the voltage regulation signal VRS and adjusts the voltage value of the driving voltage DV from the first voltage value to the second voltage value in response to the voltage regulation signal VRS.

It is worth mentioning that, it is assumed that the value of selecting signal SS is related to the delay stage of the delay line circuit in the foregoing exemplary embodiments. For example, if the value of the current selecting signal SS is greater than the threshold, it indicates that the current selecting signal SS instructs to use the delay stage exceeding a preset delay stage; and if the value of the current selecting signal SS is not greater than the threshold, it indicates that the current selecting signal SS instructs to use the delay stage not exceeding the preset delay stage. However, in another exemplary embodiment, if the selecting signal SS has a variety of signal types (e.g., "000," "001," "0010" or "00011," etc.) and each signal type instructs one delay stage, it is also possible that whether the delay stage instructed by the current selecting signal SS exceeds a preset delay stage can be known by determining whether the signal type of the current selecting signal SS belongs to specific types. In the present exemplary embodiment, the preset delay stage is set to 80% of a maximum delay stage. For example, assuming that the maximum delay stage of each of the delay line circuits 112 and 122 is 100 stages, the preset delay stage may be set to 80 stages accordingly. However, in another exemplary embodiment, the preset delay stage may also be set to 70% or 90% of the maximum delay stage instead of being limited to the above. Alternatively, from another perspective, if the delay stage instructed by the current selecting signal SS exceeds the preset delay stage, it indicates that the current selecting signal SS matches aforesaid preset condition.

In the present exemplary embodiment, the voltage value of the driving voltage DV is, for example, negatively correlated to the delay ability of each of the clock delay circuits 112 and 122. If the delay stage instructed by the current selecting signal SS exceeds the preset delay stage, it indicates that the voltage value of the driving voltage DV currently provided may be overly high. Therefore, the voltage regulation circuit 134 decreases the voltage value of the driving voltage DV in order to improve the delay ability of each of the delay line circuits 112 and 122. Accordingly, the delay stage used by each of the delay line circuits 112 and 122 may be decreased in subsequent process.

In an exemplary embodiment, if the current selecting signal SS matches aforesaid preset condition, the voltage control circuit 13 further outputs a reset signal RS. The clock control circuit 11 receives the reset signal RS and performs the delay lock again in response to the reset signal RS. For example, if the value of the current selecting signal SS is greater than aforesaid threshold, the comparison circuit 132 outputs the reset signal RS to the state machine circuit 114. After the reset signal RS is received, the state machine circuit 114 generates the selecting signal SS again according to the phase difference between the reference clock signal RCS and the internal clock signal ICS.

Figure 2:
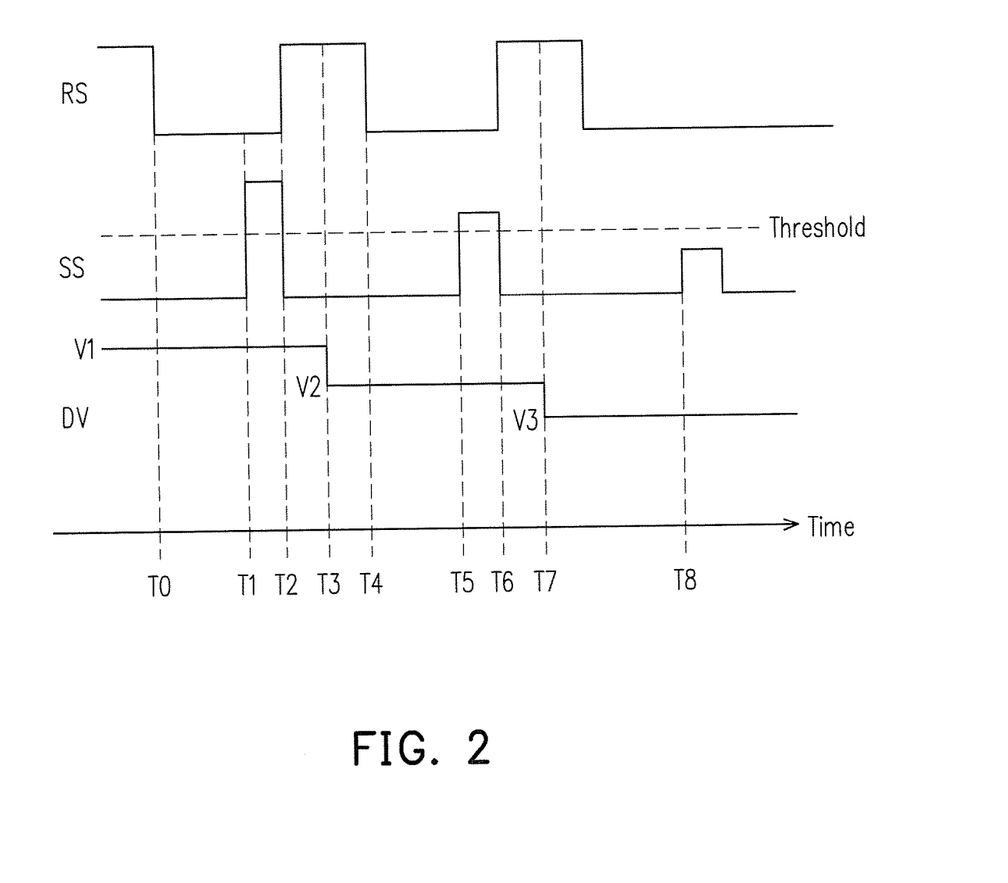
FIG. 2 is a schematic diagram illustrating a signal time sequence according to an exemplary embodiment of the invention.

FIG. 2 is a schematic diagram illustrating a signal time sequence according to an exemplary embodiment of the invention.

Referring to FIG. 2, it is assumed that voltage value of the current driving voltage DV is V1. At a time point T0, the reset signal RS is outputted (e.g., the reset signal RS is switched from a high level to a low level), and the delay lock is performed in response to the reset signal RS being outputted. At a time point T1, the selecting signal SS is outputted according to the delay lock being performed. Between the time point T1 and a time point T2, the selecting signal SS is determined as matching the preset condition (e.g., the value of the selecting signal SS is higher than the threshold). At a time point T3, the voltage value of the driving voltage DV is decreased to V2. At a time point T4, the reset signal RS is outputted again (e.g., the reset signal RS is switched from the high level to the low level), and the delay lock is performed again in response to the reset signal RS being outputted. At a time point T5, the selecting signal SS is outputted according to the delay lock being performed. Between the time point T5 and a time point T6, the selecting signal SS is determined as matching the preset condition again (e.g., the value of the selecting signal SS is higher than the threshold). At a time point T7, the voltage value of the driving voltage DV is further decreased to V3. Then, the reset signal RS is outputted again and the delay lock is performed again. At a time point T8, the selecting signal SS is outputted according to the delay lock being performed, and the selecting signal SS is determined as not matching the preset condition (e.g., the value of the selecting signal SS is lower than the threshold). Meanwhile, the voltage value of the driving voltage DV is maintained at V3.

In view of FIG. 2, the value of the selecting signal SS outputted at the time point T1 is significantly higher than the threshold, and it indicates that the delay stage instructed by the selecting signal SS is very high. Therefore, if the voltage value of driving voltage DV for driving the delay line circuits 112 and 122 are not correspondingly decreased, it is possible that the delay line circuit 112 and 122 are incapable of generating a sufficient delay amount. However, if the voltage value of the driving voltage DV is decreased as shown in FIG. 2, the delay ability of each of the delay line circuits 112 and 122 may be improved in order to lower a probability that the delay line circuits 112 and 122 are incapable of generating the sufficient delay amount.

Figure 3:
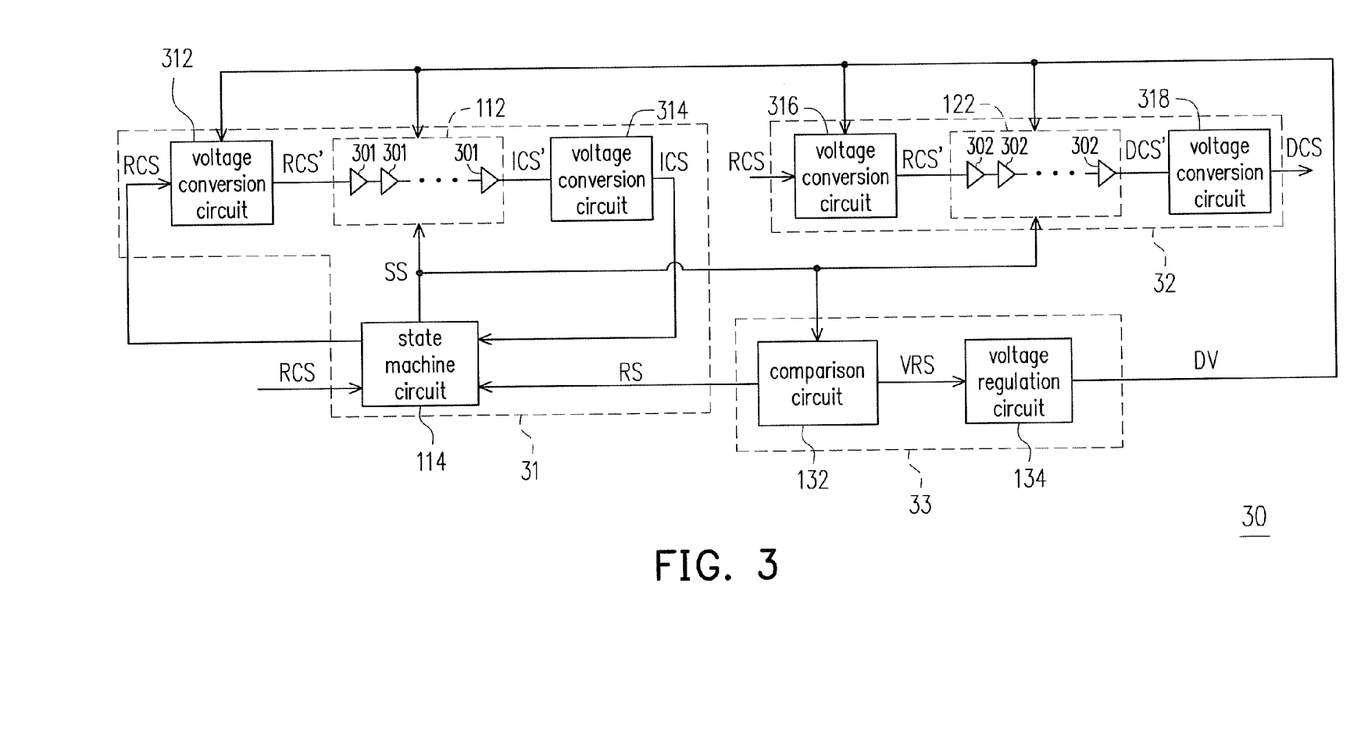
FIG. 3 is a schematic diagram illustrating a delay lock loop according to another exemplary embodiment of the invention.

FIG. 3 is a schematic diagram illustrating a delay lock loop according to another exemplary embodiment of the invention.

Referring to FIG. 3, as compared to the delay lock loop 10, in a delay lock loop 30 of FIG. 3, a clock control circuit 31 further includes voltage conversion circuits 312 and 314, and a clock delay circuit 32 further includes voltage conversion circuits 316 and 318. In the present exemplary embodiment, each of the voltage conversion circuits 312, 314, 316 and 318 may be a level shifter.

The voltage conversion circuit 312 is serially connected between a voltage conversion circuit 33 and the delay line circuit 112. The voltage conversion circuit 312 receives the reference clock signal RCS and the driving voltage DV and outputs the reference clock signal RCS' having the voltage value of the driving voltage DV. A signal input terminal of the delay line circuit 112 receives the reference clock signal RCS', and a power input terminal of the delay line circuit 112 receives the driving voltage DV. When the reference clock signal RCS' passes through the delay line circuit 122, a signal output terminal of the delay line circuit 122 outputs an internal clock signal ICS' having the voltage value of the driving voltage DV.

The voltage conversion circuit 314 is serially connected between the delay line circuit 112 and the state machine circuit 114. The voltage conversion circuit 314 is configured to receive the internal clock signal ICS' and adjust a high level (or a low level) of the internal clock signal ICS' to be identical to a high level (or a low level) of the reference clock signal RCS. Then, the voltage conversion circuit 314 outputs the internal clock signal ICS.

The voltage conversion circuit 316 is serially connected between a voltage conversion circuit 33 and the delay line circuit 122. The voltage conversion circuit 316 receives the reference clock signal RCS and the driving voltage DV and outputs the reference clock signal RCS' having the voltage value of the driving voltage DV. A signal input terminal of the delay line circuit 122 receives the reference clock signal RCS', and a power input terminal of the delay line circuit 122 receives the driving voltage DV. When the reference clock signal RCS' passes through the delay line circuit 122, a signal output terminal of the delay line circuit 122 outputs a delay clock signal DCS' having the voltage value of the driving voltage DV.

The voltage conversion circuit 318 is coupled to the delay line circuit 122. The voltage conversion circuit 318 is configured to receive the delay clock signal DCS' and adjust a high level (or a low level) of the delay clock signal DCS' to be identical to the high level (or the low level) of the reference clock signal RCS. Then, the voltage conversion circuit 318 outputs the delay clock signal DCS.

In other words, the voltage conversion circuits 312 and 316 are configured to adjust the high level (or the low level) of the reference clock signal RCS to be delayed to be identical to the voltage value of the driving voltage DV, and the voltage conversion circuits 314 and 318 are configured to restore the high level (or the low level) of the delayed clock signals ICS' and DCS' back to be identical to the high level (or the low level) of the reference clock signal RCS.

Further, internal components of the delay line circuits 112 and 122 are further depicted in FIG. 3. For example, the delay line circuit 112 includes a plurality of delay units 301. The delay units 301 may be serially connected to one another or may be connected by using any method, and each of the delay units 301 may be one non-inverse delay element or one inverse delay element. Similarly, the delay line circuit 122 also includes a plurality of delay units 302. The delay units 302 may also be serially connected to one another or may be connected by using any method, and each of the delay units 302 may be one non-inverse delay element or one inverse delay element.

It should be noted that, in the exemplary embodiments of FIG. 1 to FIG. 3, circuit structures of the delay lock loops 10 and 30 are merely examples, in which electronic elements may be further added according to desired electrical properties of the delay lock loops 10 and 30. For example, capacitance, resistance and/or transistors may be added to positions where the electrical properties need to be improved.

In an exemplary embodiment, the proposed delay lock loops 10 and 30 may be used in a memory storage device (also known as a memory storage system), or used in a memory control circuit unit for controlling the memory storage device. Further, in another exemplary embodiment, the delay lock loops 10 and 30 may also be applied in any electronic system.

Generally, the memory storage device includes a rewritable non-volatile memory module and a controller (also known as the control circuit). The memory storage device is usually configured together with a host system so that the host system may write data into or read data from the memory storage device.

Figure 4:
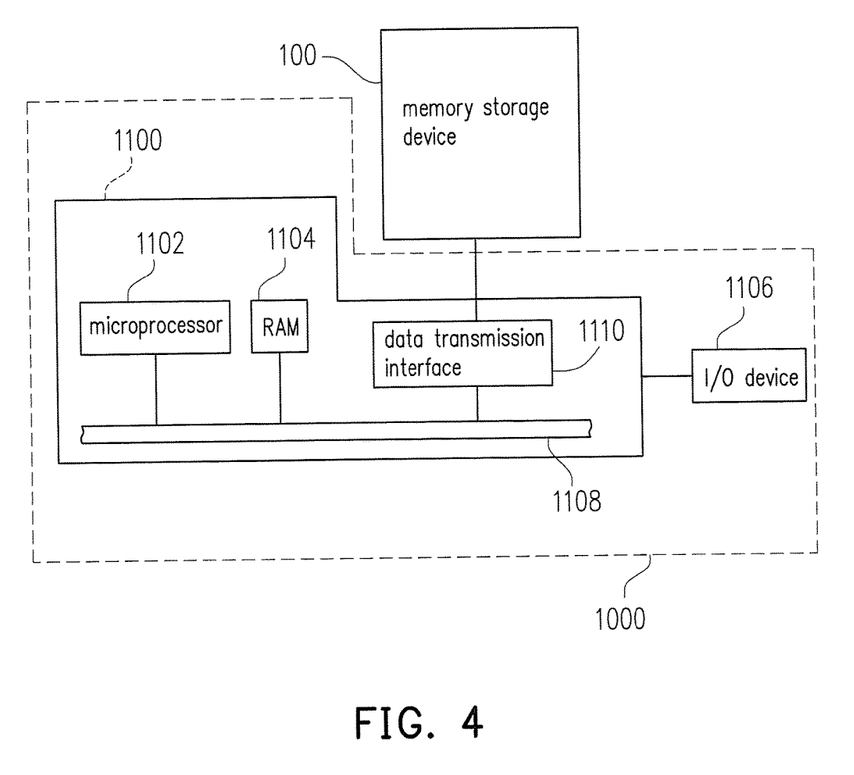
FIG. 4 is a schematic diagram illustrating a host system and a memory storage device according to an exemplary embodiment of the invention.
Figure 5:
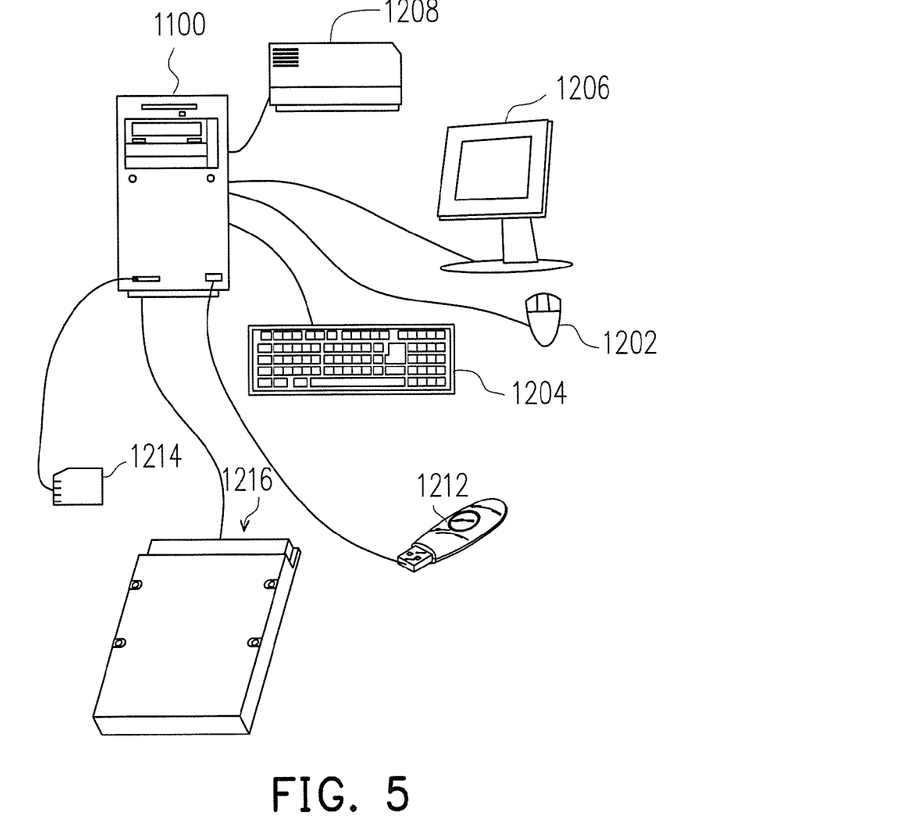
FIG. 5 is a schematic diagram illustrating a computer system and an input/output device according to an exemplary embodiment of the invention.
Figure 6:
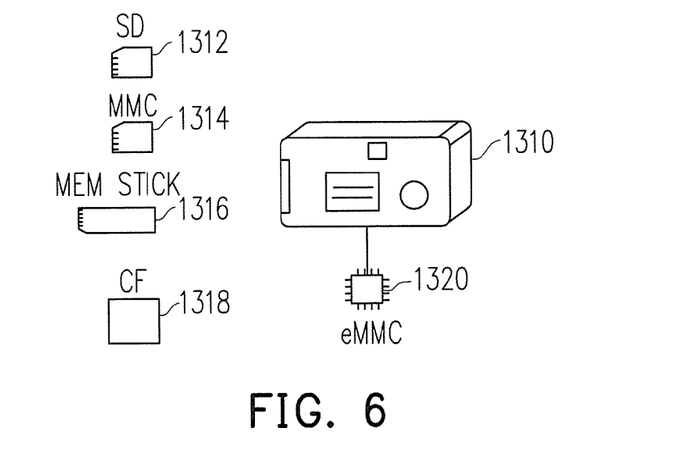
FIG. 6 is a schematic diagram illustrating a host system and a memory storage device according to an exemplary embodiment of the invention.

FIG. 4 is a schematic diagram illustrating a host system and a memory storage device according to an exemplary embodiment of the invention. FIG. 5 is a schematic diagram illustrating a computer system and an input/output device according to an exemplary embodiment of the invention. FIG. 6 is a schematic diagram illustrating a host system and a memory storage device according to an exemplary embodiment of the invention.

Figure 9:
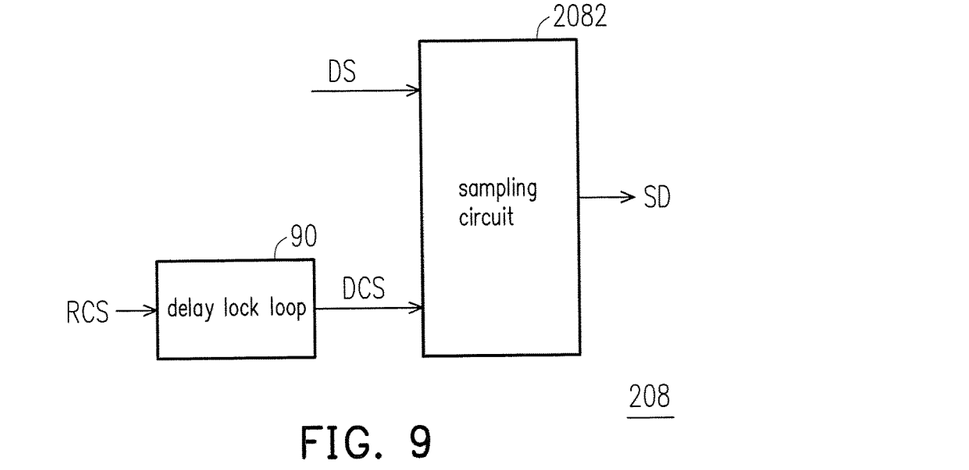
FIG. 9 is a schematic diagram illustrating a sampling circuit module according to an exemplary embodiment of the invention.

Referring to FIG. 4, a host system 1000 generally includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 9 are not intended to limit the I/O device 1106, and the I/O device 1106 may further include other devices.

The memory storage device 100 is coupled to other devices of the host system 1000 through the data transmission interface 1110. By using the microprocessor 1102, the random access memory (RAM) 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 5.

Generally, the host system 1000 may substantially be any system capable of cooperating with the memory storage device 100 for storing data. In the present exemplary embodiment, the host system 1000 is illustrated as a computer system. However, in another exemplary embodiment of the invention, the host system 1000 may be a system such as a digital camera, a video camera, a telecommunication device, an audio player, or a video player. For example, when the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 6). The embedded storage device 1320 includes an embedded MMC (eMMC). It should be mentioned that the eMMC is directly coupled to a substrate of the host system.

Figure 7:
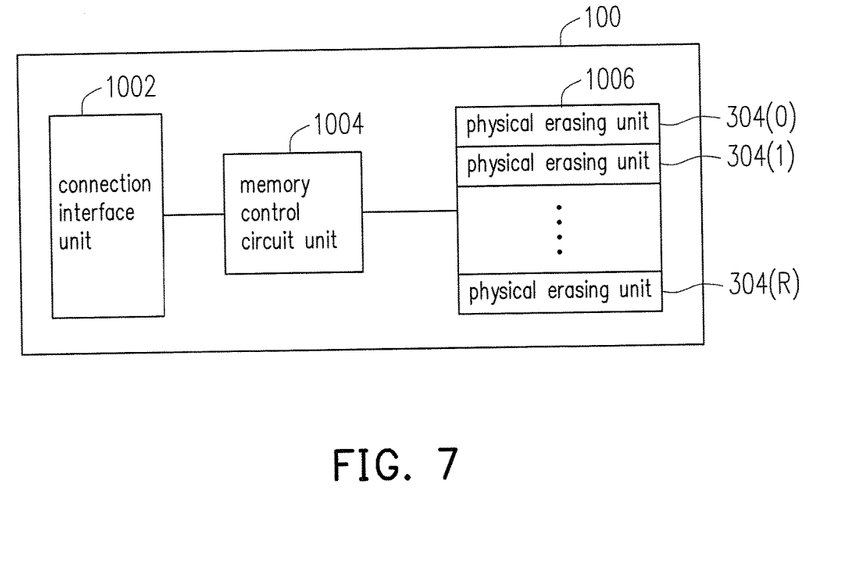
FIG. 7 is a schematic block diagram illustrating the memory storage device depicted in FIG. 4.

FIG. 7 is a schematic block diagram illustrating the memory storage device depicted in FIG. 4.

Referring to FIG. 7, the memory storage device 100 includes a connection interface unit 1002, a memory control circuit unit 1004 and a rewritable non-volatile memory module 1006.

In the present exemplary embodiment, the connection interface unit 1002 is compatible with a serial advanced technology attachment (SATA) standard. However, the invention is not limited thereto, and the connection interface unit 1002 may also be compatible with Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory control circuit unit may be packaged into one chip, or distributed outside of a chip containing the memory control circuit unit.

The memory control circuit unit 1004 is configured to execute a plurality of logic gates or control commands which are implemented in a hardware form or in a firmware form, so as to execute operations of writing, reading or erasing data in the rewritable non-volatile memory storage module 1006 according to the commands of the host system 1000.

The rewritable non-volatile memory module 1006 is coupled to the memory control circuit unit 1004 and configured to store data written from the host system 1000. The rewritable non-volatile memory storage module 1006 includes multiple physical erasing units 304(0) to 304(R). The physical erasing units 304(0) to 304(R) may belong to the same memory die or belong to different memory dies. Each physical erasing unit has a plurality of physical programming units, and the physical programming units of the same physical erasing unit may be written separately and erased simultaneously. In the present exemplary embodiment, each physical erasing unit is composed of 64 physical programming units. However, in other exemplary embodiments of the invention, each of the physical erasing units is composed of 128 or 256 physical programming units or any other amount of the physical programming units.

More specifically, the physical erasing unit is a minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 16 physical access addresses, and the size of each physical access address is 512 bytes. However, in other exemplary embodiments, the data bit area may also include more or less of the physical access addresses, and an amount and a size of the physical access addresses are not limited in the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 1006 is a Multi Level Cell (MLC) NAND flash memory module (i.e., a flash memory module capable of storing two bits of data in one memory cell). However, the disclosure is not limited thereto. The rewritable non-volatile memory module 1006 may also be a Single Level Cell (SLC) NAND flash memory module, (i.e., a flash memory module capable of storing one bit of data in one memory cell), a Trinary Level Cell (TLC) NAND flash memory module (i.e., a flash memory module capable of storing three bits of data in one memory cell), other flash memory modules or any memory module having the same features.

Figure 8:
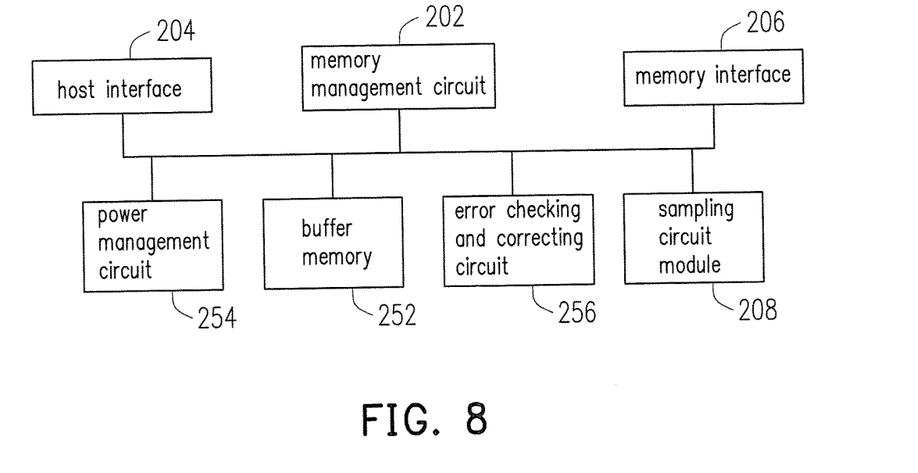
FIG. 8 is a schematic block diagram illustrating a memory control circuit unit according to an exemplary embodiment of the invention.

FIG. 8 is a schematic block diagram illustrating a memory control circuit unit according to an exemplary embodiment of the invention.

Referring to FIG. 8, the memory control circuit unit 1004 includes a memory management circuit 202, a host interface 204, a memory interface 206 and a sampling circuit module 208.

The memory management circuit 202 is configured to control overall operations of the memory control circuit unit 1004. Specifically, the memory management circuit 202 has a plurality of control commands. During operations of the memory storage device 100, the control commands are executed to execute various operations such as writing, reading and erasing data.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing the system data) of the rewritable non-volatile memory module 1006. In addition, the memory management circuit 202 has a microprocessor unit (not illustrated), the read only memory (not illustrated) and a random access memory (not illustrated). Particularly, the read only memory has an activate code, which is executed by the microprocessor unit to load the control commands stored in the rewritable non-volatile memory module 1006 to the random access memory of the memory management circuit 202 when the memory control circuit unit 1004 is enabled. Thereafter, the control commands are executed by the microprocessor unit to execute operations of writing, reading or erasing data.

Further, in another exemplary embodiment of the invention, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 1006; the memory writing circuit is configured to issue a write command to the rewritable non-volatile memory module 1006 in order to write data into the rewritable non-volatile memory module 1006; the memory reading circuit is configured to issue a read command to the rewritable non-volatile memory module 1006 in order to read data from the rewritable non-volatile memory module 1006; the memory erasing circuit is configured to issue an erase command to the rewritable non-volatile memory module 1006 in order to erase data from the rewritable non-volatile memory module 1006; the data processing circuit is configured to process both the data to be written to the rewritable non-volatile memory module 1006 and the data to be read from the rewritable non-volatile memory module 1006.

The host interface 204 is coupled to the memory management circuit 202 and configured for receiving and identifying commands and data sent from the host system 1000. In other words, the commands and data sent from the host system 1000 are passed to the memory management circuit 202 through the host interface 204. In the present exemplary embodiment, the host interface 204 is compatible with a SATA standard. However, it should be understood that the present invention is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 1006. That is, data to be written to the rewritable non-volatile memory module 1006 is converted to a format acceptable to the rewritable non-volatile memory module 1006 through the memory interface 206. Specifically, if the memory management circuit 202 intends to access the rewritable non-volatile memory module 1006, the memory interface 206 sends corresponding command sequences. The command sequences may include one or more signals, or data from the bus. For example, in a read command sequence, information such as identification codes and memory addresses are included.

The sampling circuit module 208 is coupled to the memory management circuit 202 and configured to sample a data signal in order to obtain and output a sampling data. The data signal may be related to the data to be written into the rewritable non-volatile memory module 1006 by the host system 1000, or related to the data to be read from the rewritable non-volatile memory module 1006.

FIG. 9 is a schematic diagram illustrating a sampling circuit module according to an exemplary embodiment of the invention.

Referring to FIG. 9, the sampling circuit module 208 includes a delay lock loop 90 and a sampling circuit 2082.

The clock control circuit 90 is configured to receive a reference clock signal RCS and perform a delay lock for the reference clock signal RCS in order to output a delay clock signal DCS. The delay lock loop 90 is identical to similar to aforesaid delay lock loops 10 or 30, which are not repeated hereinafter.

In another exemplary embodiment, the delay lock loop 90 may also be disposed outside the memory control circuit unit 1004 to provide the delay clock signal DCS to the memory control circuit unit 1004. Further, in an exemplary embodiment, the delay lock loop 90 may also provide the delay clock signal DCS to other chips (or circuit elements) in the memory storage device 100, and the invention is not limited thereto.

The sampling circuit 2082 is coupled to the delay lock loop 90 and configured to sample a data signal DS according to the delay clock signal DCS. The data signal DS may be related to the data to be written into the rewritable non-volatile memory module 1006 by the host system 1000, or related to the data to be read from the rewritable non-volatile memory module 1006. The sampling circuit 2082 samples the data signal DS according to the delay clock signal DCS in order to obtain a sampling data SD and output the sampling data SD. Then, the memory management circuit 202 may transmit the corresponding data to the rewritable non-volatile memory module 1006 or the host system 1000 according to the sampling data SD. In an exemplary embodiment, the data corresponding to the sampling data SD may be bit data included in the sampling data SD. After the sampling data SD is obtained, the memory management circuit 202 may transmit the sampling data SD to the rewritable non-volatile memory module 1006 or to the host system 1000. However, in another exemplary embodiment, the data corresponding to the sampling data SD is bit data which is obtained by verifying or converting the sampling data SD.

If the data signal DS is related to the data to be written into the rewritable non-volatile memory module 1006 by the host system 1000, the memory management circuit 202 obtains one or more bits (also known as a first bit) according to the sampling data SD. The memory management circuit 202 sends a write command sequence to the rewritable non-volatile memory module 1006, and the write command sequence is configured to instruct writing the first bit into the rewritable non-volatile memory module 1006. The write command sequence may include one or more instruction codes or program codes.

If the sampling data SD is related to the data to be read from the rewritable non-volatile memory module 1006, the memory management circuit 202 obtains one or more bit (also known as a second bit) according to the sampling data SD. The memory management circuit 202 transmits the second bit to the host system 1000.

In an exemplary embodiment, the memory control circuit unit 1004 further includes a buffer memory 252, a power management circuit 254 and an error checking and correcting circuit 256. The buffer memory 252 is coupled to the memory management circuit 202 and configured to temporarily store data and commands from the host system 1000 or data from the rewritable non-volatile memory module 1006. The power management unit 254 is coupled to the memory management circuit 202 and configured to control a power of the memory storage device 100. The error checking and correcting circuit 256 is coupled to the memory management circuit 202 and configured to perform an error checking and correcting process to ensure the correctness of data. Specifically, when the memory management circuit 202 receives a write command from the host system 1000, the error checking and correcting circuit 256 generates an error checking and correcting code (ECC code) for data corresponding to the write command, and the memory management circuit 202 writes data and the ECC code corresponding to the write command to the rewritable non-volatile memory module 1006. Subsequently, when the memory management circuit 202 reads the data from the rewritable non-volatile memory module 1006, the ECC code corresponding to the data is also read, and the error checking and correcting circuit 256 may execute the error checking and correcting procedure for the read data according to the ECC code.

Figure 10:
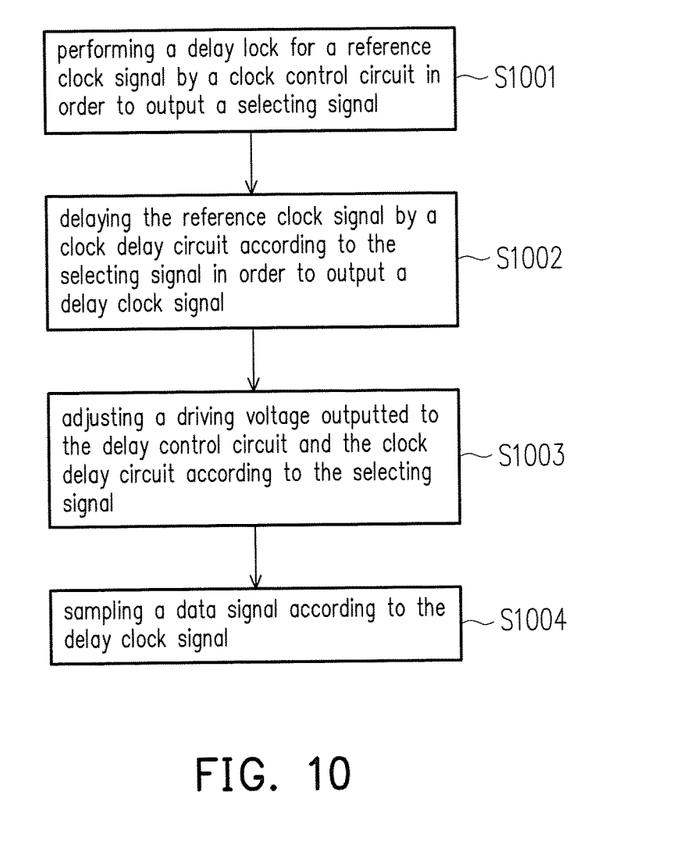
FIG. 10 is a flowchart illustrating a data sampling method according to an exemplary embodiment of the invention.

FIG. 10 is a flowchart illustrating a data sampling method according to an exemplary embodiment of the invention. Referring to FIG. 10, in step S1001, a delay lock is performed by a clock control circuit for a reference clock signal in order to output a selecting signal. In step S1002, the reference clock signal is delayed by a clock delay circuit according to the selecting signal in order to output a delay clock signal. In step S1003, a driving voltage outputted to the clock control circuit and the clock delay circuit is adjusted according to the selecting signal. In step S1004, a data signal is sampled according to the delay clock signal in order to obtain a sampling data.

It is worth mentioning that, the steps depicted in FIG. 10 may be implemented as a plurality of program codes or circuits, which are not particularly limited in the invention. Moreover, the method disclosed in FIG. 10 may be implemented by reference with each of above embodiments, or may be implemented separately, which are not particularly limited in the invention.

In summary, the invention is capable of adjusting the driving voltage provided to the clock control circuit and the clock delay circuit according to the selecting signal for controlling the delay stage without using additional delay elements, so as to effectively improve the delay ability of the delay lock loop.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sampling circuit module, comprising:
    a delay lock loop and a sampling circuit,
    wherein the delay lock loop comprises:
    a clock control circuit, configured to delay a reference clock signal and perform a delay lock for the reference clock signal and output a selecting signal;
    a clock delay circuit, coupled to the clock control circuit and configured to receive the reference clock signal and the selecting signal, and delay the reference clock signal according to the selecting signal in order to output a delay clock signal; and a voltage control circuit, coupled to the clock control circuit and the clock delay circuit and configured to receive the selecting signal and adjust a driving voltage outputted to the clock control circuit and the clock delay circuit according to the received selecting signal, wherein a delay ability of the clock delay circuit is affected by the driving voltage, wherein the sampling circuit is coupled to the delay lock loop and configured to sample a data signal according to the delay clock signal, wherein a delay stage of the clock delay circuit configured to delay the reference clock signal by the clock delay circuit and a delay stage of the clock control circuit configured to delay the reference clock signal by the clock control circuit are instructed by the selecting signal, wherein the delay stage of the clock delay circuit and the delay stage of the clock control circuit are not instructed by the driving voltage.

2. The sampling circuit module of claim 1, wherein the operation of adjusting the driving voltage according to the selecting signal by the voltage control circuit comprises:
determining whether the selecting signal matches a preset condition; and
if the selecting signal matches the preset condition, adjusting a voltage value of the driving voltage from a first voltage value to a second voltage value, wherein the second voltage value is different from the first voltage value.

3. The sampling circuit module of claim 2, wherein the voltage control circuit comprises a comparison circuit and a voltage regulation circuit,
wherein the comparison circuit is coupled the clock control circuit and configured to determine whether a value of the selecting signal is greater than a threshold,
wherein if the value of the selecting signal is greater than the threshold, the comparison circuit is further configured to output a voltage regulation signal,
wherein the voltage regulation circuit is coupled to the comparison circuit and configured to adjust the voltage value of the driving voltage from the first voltage value to the second voltage value in response to the voltage regulation signal.

4. The sampling circuit module of claim 2, wherein the second voltage value is lower than the first voltage value.

5. The sampling circuit module of claim 2, wherein if the selecting signal matches the preset condition, the voltage control circuit is further configured to output a reset signal,
wherein the clock control circuit is further configured to receive the reset signal and perform the delay lock in response to the reset signal.

6. The sampling circuit module of claim 1, wherein the clock control circuit comprises a first delay line circuit, and the clock delay circuit comprises a second delay line circuit,
wherein the voltage control circuit outputs the driving voltage to the first delay line circuit and the second delay line circuit.

7. The sampling circuit module of claim 6, wherein the clock control circuit further comprises a voltage conversion circuit, and the voltage conversion circuit is serially connected between the voltage control circuit and the first delay line circuit,
wherein the voltage conversion circuit is configured to receive the reference clock signal and the driving voltage and output the reference clock signal having a voltage value of the driving voltage to the first delay line circuit.

8. The sampling circuit module of claim 1, wherein a voltage value of the driving voltage is negatively correlated to the delay ability of the clock delay circuit.

9. A memory control circuit unit, configured to control a rewritable non-volatile memory module, wherein the memory control circuit unit comprises:
a host interface, configured to couple to a host system;
a memory interface, configured to couple to the rewritable non-volatile memory module; and
a sampling circuit module, wherein the sampling circuit module comprises a delay lock loop and a sampling circuit,
wherein the delay lock loop comprises:
a clock control circuit, configured to delay a reference clock signal and perform a delay lock for the reference clock signal and output a selecting signal;
a clock delay circuit, coupled to the clock control circuit and configured to receive the reference clock signal and the selecting signal, and delay the reference clock signal according to the selecting signal in order to output a delay clock signal; and
a voltage control circuit, coupled to the clock control circuit and the clock delay circuit and configured to receive the selecting signal and adjust a driving voltage outputted to the clock control circuit and the clock delay circuit according to the received selecting signal, wherein a delay ability of the clock delay circuit is affected by the driving voltage,
wherein the sampling circuit is coupled to the delay lock loop and configured to sample a data signal according to the delay clock signal,
wherein a delay stage of the clock delay circuit configured to delay the reference clock signal by the clock delay circuit and a delay stage of the clock control circuit configured to delay the reference clock signal by the clock control circuit are instructed by the selecting signal,
wherein the delay stage of the clock delay circuit and the delay stage of the clock control circuit are not instructed by the driving voltage.

10. The memory control circuit unit of claim 9, wherein the operation of adjusting the driving voltage according to the selecting signal by the voltage control circuit comprises:
determining whether the selecting signal matches a preset condition; and
if the selecting signal matches the preset condition, adjusting a voltage value of the driving voltage from a first voltage value to a second voltage value, wherein the second voltage value is different from the first voltage value.

11. The memory control circuit unit of claim 10, wherein the voltage control circuit comprises a comparison circuit and a voltage regulation circuit,
wherein the comparison circuit is coupled the clock control circuit and configured to determine whether a value of the selecting signal is greater than a threshold,
wherein if the value of the selecting signal is greater than the threshold, the comparison circuit is further configured to output a voltage regulation signal,
wherein the voltage regulation circuit is coupled to the comparison circuit and configured to adjust the voltage value of the driving voltage from the first voltage value to the second voltage value in response to the voltage regulation signal.

12. The memory control circuit unit of claim 10, wherein the second voltage value is lower than the first voltage value.

13. The memory control circuit unit of claim 10, wherein if the selecting signal matches the preset condition, the voltage control circuit is further configured to output a reset signal,
wherein the clock control circuit is further configured to receive the reset signal and perform the delay lock in response to the reset signal.

14. The memory control circuit unit of claim 9, wherein the clock control circuit comprises a first delay line circuit, and the clock delay circuit comprises a second delay line circuit,
wherein the voltage control circuit outputs the driving voltage to the first delay line circuit and the second delay line circuit.

15. The memory control circuit unit of claim 14, wherein the clock control circuit further comprises a voltage conversion circuit, and the voltage conversion circuit is serially connected between the voltage control circuit and the first delay line circuit,
wherein the voltage conversion circuit is configured to receive the reference clock signal and the driving voltage and output the reference clock signal having a voltage value of the driving voltage to the first delay line circuit.

16. The memory control circuit unit of claim 9, wherein a voltage value of the driving voltage is negatively correlated to the delay ability of the clock delay circuit.

17. A data sampling method, comprising:
delaying a reference clock signal, performing a delay lock for the reference clock signal and outputting a selecting signal by a clock control circuit;
receiving the reference clock signal and the selecting signal and delaying the reference clock signal by a clock delay circuit according to the selecting signal in order to output a delay clock signal;
receiving the selecting signal by a voltage control circuit and adjusting a driving voltage outputted to the clock control circuit and the clock delay circuit according to the received selecting signal, wherein a delay ability of the clock delay circuit is affected by the driving voltage; and
sampling a data signal according to the delay clock signal, wherein a delay stage of the clock delay circuit configured to delay the reference clock signal by the clock delay circuit and a delay stage of the clock control circuit configured to delay the reference clock signal by the clock control circuit are instructed by the selecting signal,
wherein the delay stage of the clock delay circuit and the delay stage of the clock control circuit are not instructed by the driving voltage.

18. The data sampling method of claim 17, wherein the step of adjusting the driving voltage according to the selecting signal comprises:
determining whether the selecting signal matches a preset condition; and
if the selecting signal matches the preset condition, adjusting a voltage value of the driving voltage from a first voltage value to a second voltage value, wherein the second voltage value is different from the first voltage value.

19. The data sampling method of claim 18, wherein the step of determining whether the selecting signal matches the preset condition comprises:
determining whether a value of the selecting signal is greater than a threshold;
wherein if the selecting signal matches the preset condition, the step of adjusting the voltage value of the driving voltage from the first voltage value to the second voltage value comprises:
if the value of the selecting signal is greater than the threshold, outputting a voltage regulation signal; and
adjusting the voltage value of the driving voltage from the first voltage value to the second voltage value in response to the voltage regulation signal.

20. The data sampling method of claim 18, wherein the second voltage value is lower than the first voltage value.

21. The data sampling method of claim 18, further comprising:
if the selecting signal matches the preset condition, outputting a reset signal; and
receiving the reset signal and performing the delay lock in response to the reset signal by the clock control circuit.

22. The data sampling method of claim 17, wherein the clock control circuit comprises a first delay line circuit, and the clock delay circuit comprises a second delay line circuit,
wherein the driving voltage is outputted to the first delay line circuit and the second delay line circuit.

23. The data sampling method of claim 22, further comprising:
receiving the reference clock signal and the driving voltage, and outputting the reference clock signal having a voltage value of the driving voltage to the first delay line circuit.

24. The data sampling method of claim 17, wherein a voltage value of the driving voltage is negatively correlated to the delay ability of the clock delay circuit.

* * * * *